United States Patent [19]
Emile, Jr.

[11] 4,367,467
[45] Jan. 4, 1983

[54] LCD DISPLAY MOUNT WINDOW

[75] Inventor: Philip Emile, Jr., Roseland, N.J.

[73] Assignee: Sangamo Weston, Inc., Atlanta, Ga.

[21] Appl. No.: 230,408

[22] Filed: Jan. 30, 1981

[51] Int. Cl.³ .............................................. G08B 5/36
[52] U.S. Cl. ............................... 340/765; 340/815.20; 340/815.67; 340/718; 350/339 R
[58] Field of Search ............... 340/366 E, 378.4, 718, 340/762, 765; 350/339 R, 144; 361/419; 324/96

[56] References Cited
U.S. PATENT DOCUMENTS

| | | | |
|---|---|---|---|
| 3,505,804 | 4/1970 | Hofstein | 340/765 X |
| 3,718,842 | 2/1973 | Abbott et al. | 340/765 X |
| 3,863,436 | 2/1975 | Schwarzschild et al. | 340/765 X |
| 4,202,608 | 5/1980 | Kaufmann | 350/339 R |
| 4,204,205 | 5/1980 | Yagi et al. | 340/719 |

FOREIGN PATENT DOCUMENTS 54-99598 8/1979 Japan ............................ 340/765

*Primary Examiner*—David L. Trafton
*Attorney, Agent, or Firm*—Lowe, King, Price & Becker

[57] ABSTRACT

In a device for mounting a liquid crystal display (LCD) to a circuit board, a holder is positioned between the LCD and the circuit board and a cover member positioned around the LCD and holder is secured to the board. The LCD is recessed slightly within the cover member and is exposed through the cover at a display opening. To compensate for the recess of the LCD within the cover member, an optically clear lens is positioned with its lower surface in contact with the LCD and upper surface extending outwardly through the display opening. An image of the alphanumeric characters displayed by the LCD is projected on the outer surface of the lens of create an optical illusion of the display characters at the surface of the cover.

8 Claims, 11 Drawing Figures

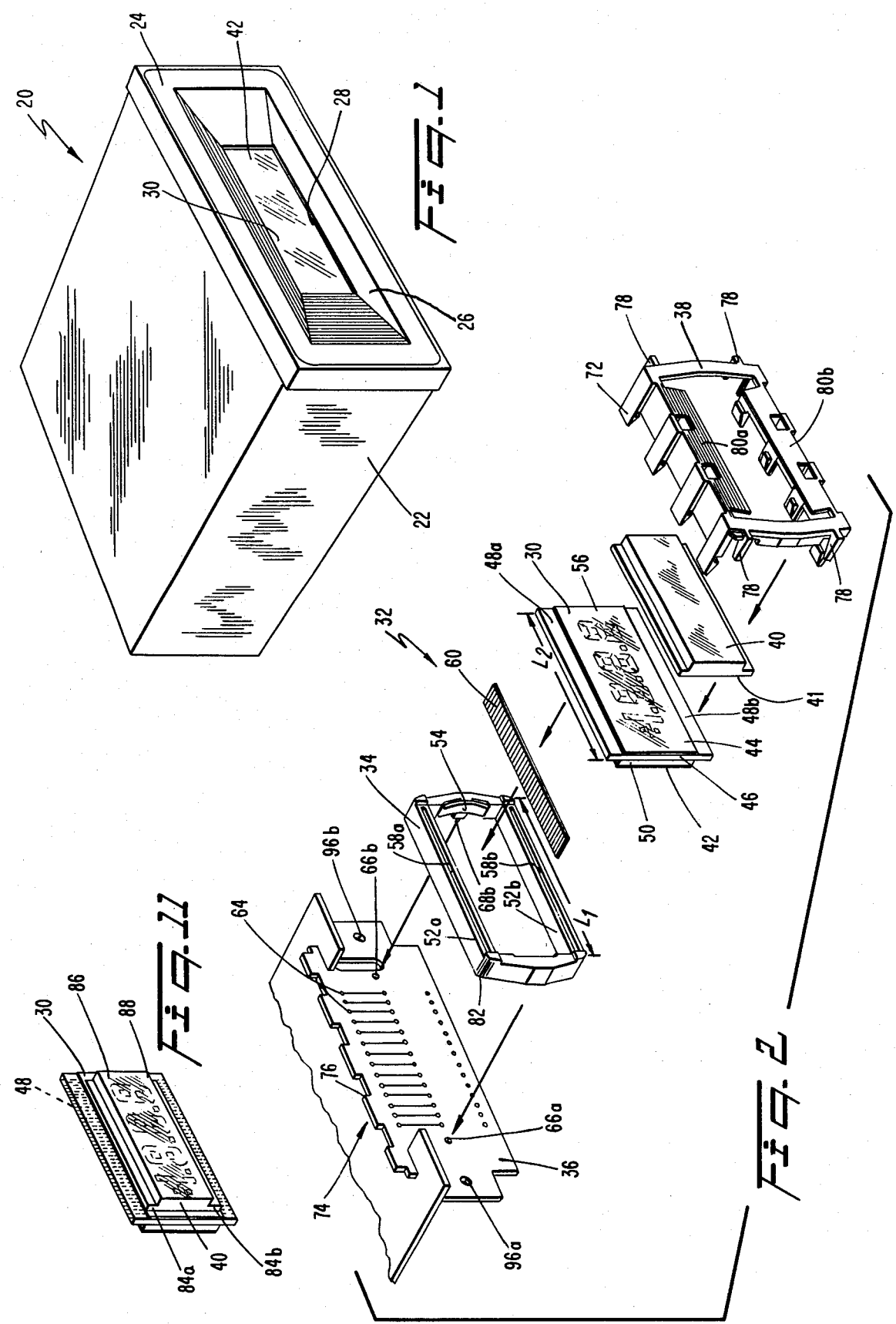

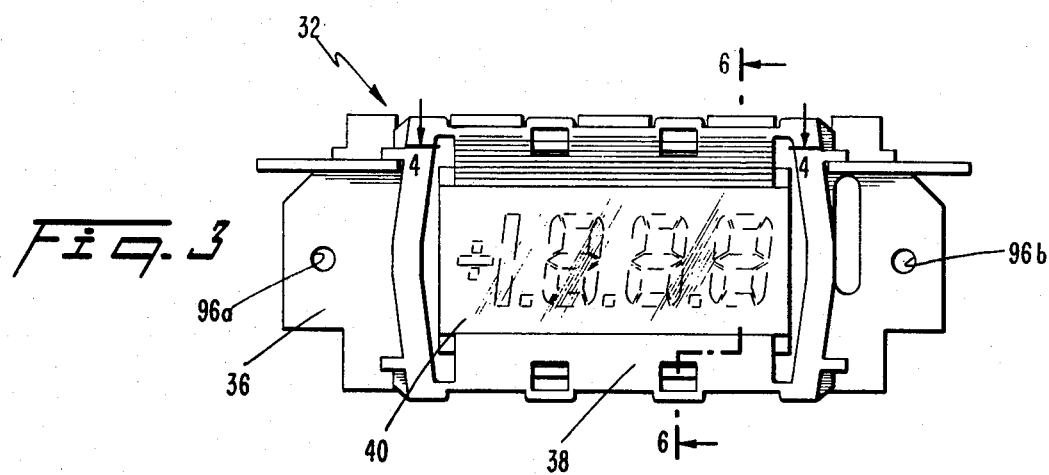
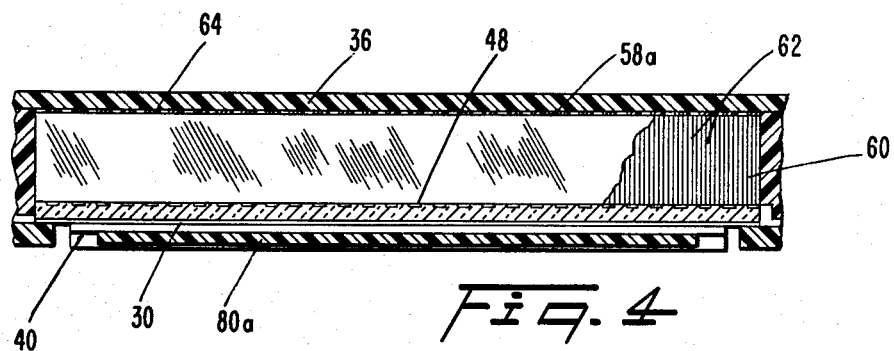
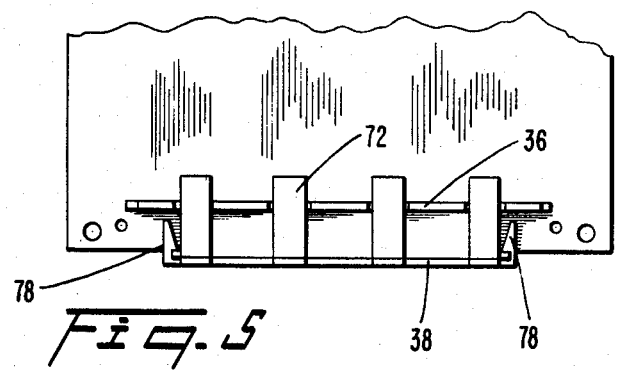
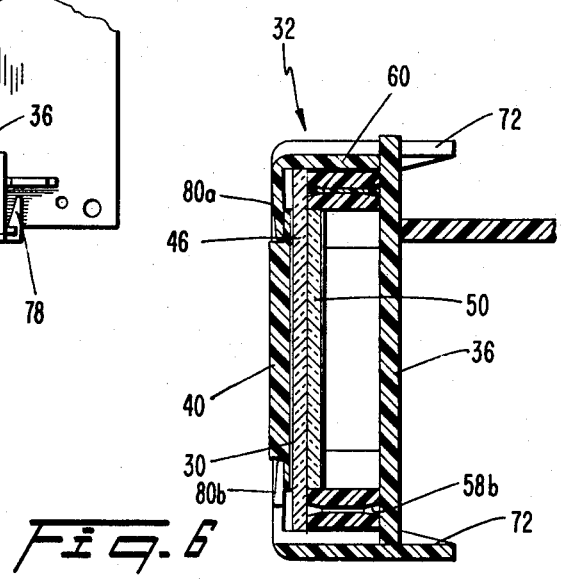

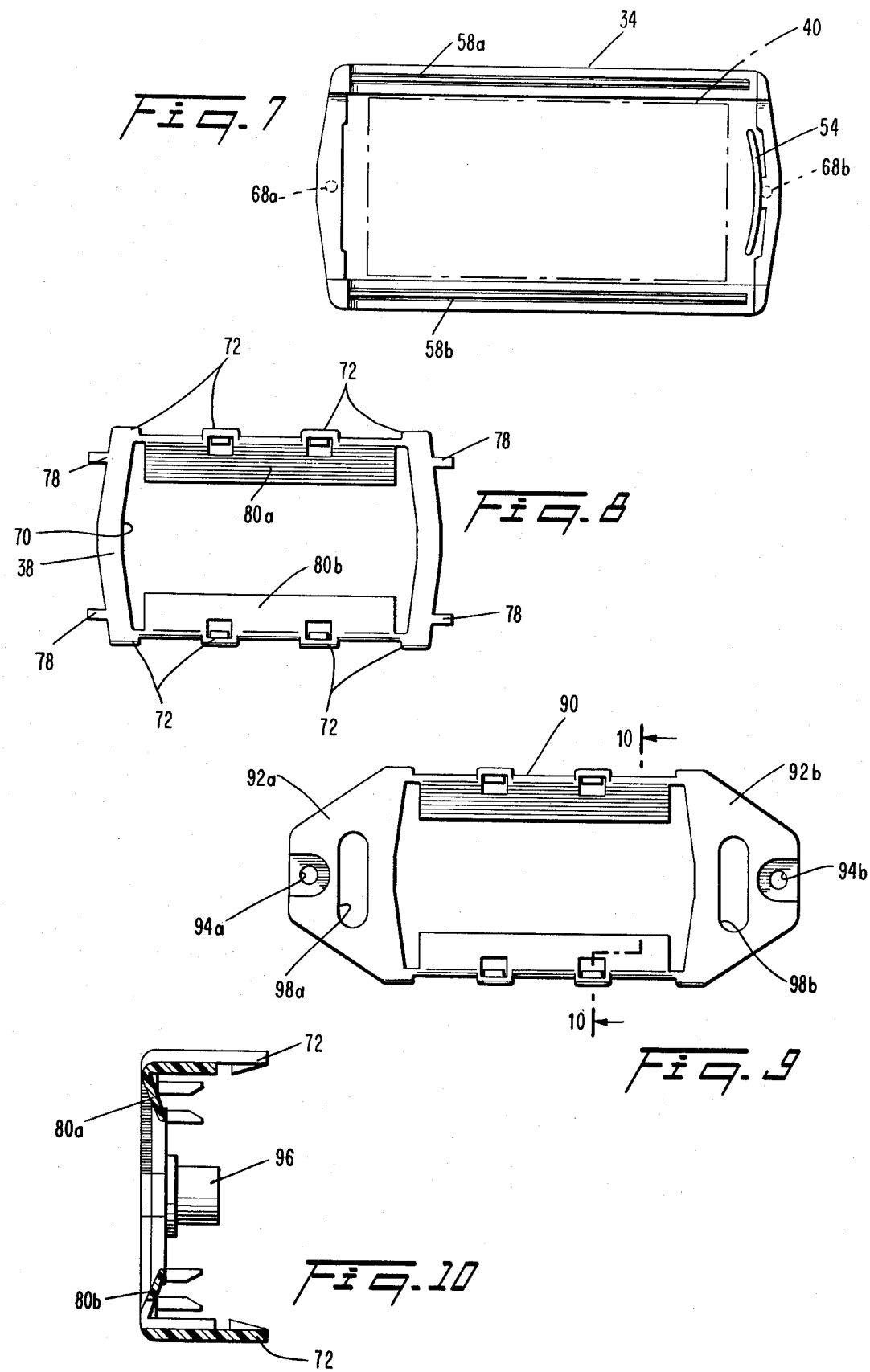

LCD DISPLAY MOUNT WINDOW

TECHNICAL FIELD

The present invention relates generally to liquid crystal displays, more particularly toward corrective optics for a display assembly wherein an LCD is recessed beneath a protective cover member and the display assembly is secured to a circuit board carrying display signals.

CROSS-REFERENCE TO RELATED APPLICATION

This application is related to application Ser. No. 230,409 filed on Jan. 30, 1981, and assigned to the assignee of this application.

BACKGROUND ART

Liquid crystals (LCD's) are commonly employed to display alphanumeric data obtained by electronic instrumentation in response to measured parameters, such as voltage, current, resistance, etc. A liquid crystal material is one which is birefringent and exhibits interference patterns and polarized light resulting from parallel orientation of large clusters of molecules. Depending upon the magnitude of voltage applied between parallel back plane and segment conductors, characters are formed by light reflected from the particular segments upon which the display voltage is applied. Because LCD devices have a very high internal impedance, the current drawn by the devices is small marking LCD's desirable for battery-operated instrumentation.

In compact instrumentation, the LCD is typically mounted on a printed circuit board having a conductive pattern for applying electrical signals to corresponding conductors on a surface of the LCD extending from the segment electrodes. The LCD is generally mounted directly on the printed circuit board using mounting bolts, screws or accessory pieces. There is often a critical alignment problem to ensure electrical coupling between the circuit board and LCD which must be taken into account when the LCD is screwed or bolted to the circuit board. LCD assembly time is thus substantial and it is difficult to subsequently disassemble the display for calibration or repair since access must be made to the fastening elements which are typically at least partially located behind a front panel. Furthermore, there is a tendency for the mounting bolts or screws to loosen in response to shock or vibration; this problem commonly occurs in hostile environments such as those to which cockpit-mounted instrumentation is exposed.

To provide an LCD assembly that is resistant to shock or vibration and further to simplify assembly and disassembly, a recently developed LCD mount (see U.S. application Ser. No. 230,409 filed on Jan. 30, 1981) comprises a holder or frame positioned between the LCD and circuit board to maintain the LCD in registration with a conductive pattern on the circuit board. Opposite sides of the holder are formed with through channels containing Zebra strips for establishing electrical connections between the conductive pattern on the circuit board and the LCD. A cover member positioned around the LCD and holder is formed with clips for snap fitting the cover to opposite sides of the circuit board. The LCD is exposed through a display opening formed in the cover. A pair of inwardly extending, resilient wings formed at the display opening are in contact with the surface of the LCD and tend to retain the LCD holder in contact with the printed circuit board; this structure retains electrical integrity between the circuit board and LCD in the presence of shock or vibration.

Because the LCD is recessed somewhat within the cover member by the resilient wings, however, the display is difficult to observe and the face of the instrument is aesthetically displeasing. The problem is aggravated when the LCD assembly is positioned behind a panel and a cover plate is located on the outer surface of the panel, causing the LCD to be even further recessed.

Accordingly, one object of the present invention is to provide a new and improved LCD assembly wherein the alphanumeric characters developed on an LCD that is recessed within a mounting assembly are optically projected to the front surface of the assembly.

Another object of the invention is to provide corrective optics for an LCD assembly to project LCD developed alphanumeric characters from a recessed LCD to the front surface of instrumentation.

Another object is to provide corrective optics for an LCD that does not add substantially to the cost of instrumentation.

DISCLOSURE OF INVENTION

A device for mounting a liquid crystal display (LCD) to a circuit board comprises a holder positioned between the LCD and the circuit board for maintaining the LCD offset from the surface of the board and for retaining the LCD in registration with a conductive pattern printed on the circuit board. A cover member positioned around the LCD and holder is retained to the circuit board. Electrical connections in the form of Zebra strips extend between the conductive pattern on the circuit board and the LCD conductors to apply data signals on the board to energize the LCD.

The LCD holder is retained in contact with the surface of the printed circuit board by a pair of resilient wings formed on opposite sides of the cover member and oriented toward the printed circuit board. To compensate for the recess of the LCD within the cover member, which tends to create parallax problems and to detract from the aesthetic appearance of the instrumentation, an optically clear lens is positioned between the cover member and the LCD. The lower surface of the lens is in contact with the upper surface of the LCD or slightly offset from the LCD surface. The upper surface of the lens extends outwardly through the display opening of the cover member to the plane of the outer surface of the cover member. The lens is optically flat and has an index of refraction suitable to provide a "light pipe" effect whereby an image of the LCD generated characters is projected to the upper surface of the lens to have an apperance of the characters being developed at the outer surface plane of the cover member.

BRIEF DESCRIPTION OF THE DRAWINGS

FIG. 1 is a perspective view of an LCD device assembly, in accordance with the invention, within an instrument housing;

FIG. 2 is an exploded view of the LCD device housing constructed in accordance with the principles of the present invention;

FIG. 3 is a front view of the LCD device assembly including a group of typical LCD display characters;

FIG. 4 is a cross-sectional view of the assembly of FIG. 3 taken along the line 4—4 to expose a Zebra strip forming an electrical connection between the circuit board pattern and LCD conductors;

FIG. 5 is a bottom view of the LCD assembly showing a group of mounting clips snap-fitted around one end of the circuit board;

FIG. 6 is a cross-sectional view of the assembly of FIG. 3 taken along the line 6—6 to illustrate the orientation of the wing members in contact with the LCD;

FIG. 7 is a front view of the LCD holder shown in FIG. 2;

FIG. 8 is a front view of a cover member in accordance with one preferred embodiment of the invention;

FIG. 9 is a front view of a cover member in accordance with a second preferred embodiment of the invention;

FIG. 10 is a cross-sectional side view of the cover member shown in FIG. 9 taken along the line 10—10; and FIG. 11 is a perspective view showing the corrective lens of FIG. 2 positioned on the outer surface of an LCD and projecting the character image outwardly from the LCD.

BEST MODE FOR CARRYING OUT THE INVENTION

Referring to FIG. 1, an instrument 20, such as a panel member, comprises an instrument housing 22 having an ornamental front plate 24 containing a recessed inner portion 26 and display opening 28 to expose a liquid crystal display (LCD) 30. The LCD 30, shown in more detail in FIG. 2, constitutes one element of an LCD device assembly identified generally by the numeral 32. The assembly 32 comprises a holder 34 positioned between a printed circuit board 36 and LCD 30. A cover member 38 extending around the LCD 30 and holder 34 is releasably secured to the circuit board 36 to retain the holder 34 and LCD 30 in proper position on the board. A lens 40, which is preferably optically clear, is located between the LCD 30 and cover 38 to project an image of the alphanumeric characters developed on the surface of LCD 30 to the plane 42 (see FIG. 1) of the outer surface of cover member 38.

The LCD 30, which is a commercially available device manufactured by Hamlin Corporation of Lake Mills. Wis., for example, comprises a back plane electrode 42 that is spaced apart from a character electrode 44 by a central plate 46. The rear surface of the central plate 46 is formed with a series of parallel conductors 48 (see FIG. 11) adapted to apply electrical signals to the character electrodes to form alphanumeric characters on the outer surface of the LCD at electrode 44. The LCD 30 thus has a configuration defined by outwardly extending flanges 48a, 48b and a raised central portion 50.

LCD holder 34 comprises a frame having a substantially rectangular configuration corresponding to the configuration of LCD 30. Side members 52a, 52b form seats for supporting flanges 48a, 48b of the LCD. The length $L_1$ of the holder 34 is larger than length $L_2$ of LCD 30 so that with the LCD seated on the holder 34, the LCD is retained in positioned by arcuate spring 54 in resilient contact with end 56 of the LCD (see FIG. 7).

Side members 52a 52b of holder 34 are formed with through channels 58a, 58b which receive elastomer strips 60 (only one strip is shown in FIG. 2). Strips 60, known as Zebra strips, of a type manufactured by Tecknit Corporation of Cranford, N.J., for example, are formed of alternate conducting and insulating layers defining a series of parallel conductive strips 62 (see FIG. 4) that establish electrical connections between LCD conductors 48 and a conductive pattern 64 formed on printed circuit board 36. The conductive stripes 62 have positions corresponding generally to the positions of the LCD conductors 48 but have a width substantially less than the width of each LCD conductor and also substantially less than the width of each printed circuit conductor 64. Thus, each LCD conductor 48 and circuit board conductor 64 is in contact with several conductive stripes 62 so that there is no critical alignment necessary the LCD and printed circuit conductors and conductive stripes. Thus, electrical signals applied to the circuit board are applied to the character electrodes 48 of LCD 30 through conductors 64 and 60 to energize the appropriate alphanumeric characters.

The surface of printed circuit board 36 is formed with a pair of through holes 66a, 66b which correspond in position to locater tabs 68a, 68b (see FIG. 7) formed on the underside of LCD holder 34. The tabs 68a, 68b and corresponding through holes 66a, 66b mate when the holder 34 is properly positioned on circuit board 36 with the circuit board conductors 64 and LCD conductors 48 in registration with each other.

Referring to FIG. 8, the cover member 38 comprises a substantially rectangular frame defining an opening 70 through which the alphanumeric characters developed by LCD 30 are exposed (see FIG. 3). Extending downwardly from opposite sides of the cover member 30 are a series of resilient clips 72, as best shown in FIG. 2. These clips 72 snap-fit around opposite sides of the circuit board 36, as shown in FIG. 5. As illustrated in FIG. 2 and FIG. 5, one side of circuit board 36 is formed with a series of cutout sections 76 corresponding in position to positions of the cover member clips 72. The clips 72 are seated within corresponding cutout sections 76 to maintain the cover 38 in proper position on the circuit board 36. It is pointed out, however, that the position of the LCD 30 on circuit board 36 is established by apertures 66a, 66b and locater tabs 68a, 68b independent of the position of the cover 38.

Cover 38 also is formed with a set of downwardly extending members 78 (see FIG. 2) that retain the LCD holder 34 within the cover when the assembly 32 is clipped to circuit board 36, as shown in FIG. 3.

Cover member 38 is also formed with a pair of resilient, downwardly extending wings 80a, 80b which are oriented into contact with lens 40. The wings 80a, 80b thus apply a downwardly acting force on the upper surface of lens 40 tending to retain the lower surface 82 of LCD holder 34 into firm contact with the printed circuit board 36. The lens 40 tends to evenly distribute the forces applied to LCD 30 by wings 80a, 80b and thereby protect the relatively fragile surface of the LCD. Lens 40 also provide optical compensation or correction to the assembly 32 to project an image of the LCD display characters developed on the LCD device 30 which is recessed beneath the plane 42 of the display opening (FIG. 1) outwardly to the display plane. This optical projection improves display parallax as well as improves the aesthetic appearance of the front panel of the instrumentation.

Referring to FIG. 11, the lens 40 is located on the upper surface 44 of LCD 30 at a central position to extend outwardly through cover opening 70, as shown in FIG. 6. The lens 40 is formed with a pair of outwardly extending flanges 84a, 84b and a stepped central portion 86. The central portion 86 is optically flat and the entire lens 40 is formed of a clear plastic or possibly tinted plastic material having an index of refraction suitable to cause an image of the LCD characters to be projected onto the outer surface 88 of the lens 40. A particular type of plastic suitable to provide internal reflections to create the desired image projection is a polycarbonate. Other suitable materials, however, could be used to provide the desired effect.

Thus, in accordance with one aspect of the invention, LCD device assembly 32 is assembled to a printed circuit board 36 without requiring any mounting screws, bolts, or accessory pieces. Assembly is easy since the several components shown in FIG. 2 are simply assembled to each other within cover member 38 and the cover member is then snap-fitted onto the circuit board 36. Disassembly is equally convenient since the resilient clips 32 are manually separated from the opposite sides of circuit board 36 to release the cover and remove components.

FIGS. 9 and 10 illustrate a second embodiment of cover member 38. Thus, in accordance with the embodiment of FIGS. 9 and 10, a cover member 90 is similar to cover member 38 and additionally it includes a pair of outwardly extending ears 92a, 92b having through holes 94a, 94b to receive mounting bolts for securing the cover to circuit board 36 at apertures 96a, 96b (see FIG. 2). The body of cover member 90 is offset from the upper surface of circuit board 36 by a pair of standoff elements 96 (see FIG. 10) formed around mounting apertures 94a, 94b (only one standoff element is shown in FIG. 10).

Ears 92a, 92b also are provided with a pair of elongated apertures 98a, 98b which are adapted to receive mounting bolts for mounting the assembly 32 to a panel or cover plate (not shown). The elongated configuration of apertures 98a, 98b provide some "play" for proper alignment of the assembly 32 relative to a display opening formed in the panel or cover member.

In this disclosure there is shown and described only the preferred embodiment of the invention, but as aforementioned, it is to be understood that the invention is capable of use in various other combinations and environments and is capable of changes or modifications within the scope of the invention concept as expressed therein. Lens 40, for example (see FIG. 11) may be slightly offset from the surface of LCD 38 to enable the surface 41 of the lens to be exposed to air. This structure may be provided by forming a channel (not shown) in the lens surface 41 to establish clearance between the LCD 38 and surface 41; the air has a tendency to prevent staining of the lens surface 41 due to moisture buildup.

I claim:

1. A device for mounting a liquid crystal display (LCD) to a circuit board having a conductive pattern for applying electrical signals to corresponding electrical conductors on a surface of said LCD, said device comprising:
   a holder positioned between said LCD and said circuit board, said holder including means for maintaining said LCD in registration with said conductive pattern on said circuit board,
   means for establishing electrical connections between said conductive pattern on said circuit board and the corresponding conductors on said LCD,
   a cover member positioned around said LCD and said holder, a portion of said LCD being exposed through an opening formed in said cover member, said LCD being recessed within said cover member;
   an optically clear lens located between said cover member and said LCD, said lens having a lower surface adjacent said LCD, said lens extending outwardly through the opening formed in said cover member, said lens providing a raised image of characters developed on said LCD to compensate for the recess of said LCD within said cover member; and
   means for retaining said cover member to said circuit board.

2. A liquid crystal display device assembly, comprising:
   an LCD having electrical conductors for receiving signals;
   a circuit board containing a circuit pattern corresponding in position to the electrical conductors of said LCD;
   a holder positioned between said LCD and said circuit board, said holder including means for maintaining said LCD in registration with said conductive pattern on said circuit board and the corresponding conductors on said LCD;
   means for establishing electrical connections between said conductive pattern on said circuit board and the corresponding conductors on said LCD;
   a cover member positioned around said LCD and said holder, a portion of said LCD being exposed through an opening formed in said cover member, said LCD being recessed within said cover member;
   an optically clear lens located between said cover member and said LCD, said lens having a lower surface adjacent said LCD, said lens extending outwardly through the opening formed in said cover member, said lens providing a raised image of characters developed on said LCD to compensate for the recess of said LCD within said cover member; and
   means for retaining said cover member to said circuit board.

3. The device of claim 1 or 2, wherein said cover member includes a pair of resilient wing members respectively at opposite sides of said cover opening, said wing members oriented into contact with an upper surface of said lens and resiliently biasing said LCD holder into contact with said circuit board, said lens spreading forces applied by said wing members against said LCD.

4. The device of claim 3, wherein said lens is formed with a central raised portion exposed through said cover opening and a pair of oppositely extending side flanges having a thickness less than the thickness of said central raised position, said wing members being in contact with said flanges.

5. The device of claim 4, wherein said central raised portion of said lens is optically flat.

6. The device of claim 1 or 2, wherein said lens is formed of a polycarbonate.

7. The device of claim 1 or 2, wherein said retaining means includes clip means formed on said cover member for clipping said cover member to opposite sides of said circuit board.

8. The device of claim 1 or 2, wherein opposite sides of said holder are formed with through channels, said establishing means including elastomer strips located within said through channels, said strips each containing a series of conductive stripes having positions corresponding to positions of the electrical conductors on said LCD.

* * * * *

UNITED STATES PATENT AND TRADEMARK OFFICE
CERTIFICATE OF CORRECTION

PATENT NO. : 4,367,467
DATED : January 4, 1983
INVENTOR(S) : Philip Emile, Jr.

It is certified that error appears in the above-identified patent and that said Letters Patent are hereby corrected as shown below:

In the Abstract:

Line 13, "of" (second occurrence) should read -- to --.

Column 3, line 63, "positioned" should read -- position --.

Column 4, line 7, "stripes" should read -- strips --.

Column 4, line 13, "stripes" should read -- strips --.

Column 4, line 14, insert -- between -- after "necessary".

Column 4, line 15, "stripes" should read -- strips --.

Column 4, line 31, "30" should read -- 38 --.

Column 4, line 57, "provide" should read -- provides --.

Column 5, line 18, "32" should read -- 72 --.

Column 5, line 50, "38" should read -- 30 --.

UNITED STATES PATENT AND TRADEMARK OFFICE
CERTIFICATE OF CORRECTION

PATENT NO. : 4,367,467

DATED : January 4, 1983

INVENTOR(S) : Philip Emile, Jr.

It is certified that error appears in the above-identified patent and that said Letters Patent are hereby corrected as shown below:

In the Claims:

Claim 4, column 6, line 52, "position" should read -- portion --.

Signed and Sealed this

Fifth Day of April 1983

[SEAL]

Attest:

Attesting Officer

GERALD J. MOSSINGHOFF

Commissioner of Patents and Trademarks